United States Patent [19]

Hofer et al.

[11] 4,110,681

[45] Aug. 29, 1978

[54] NMR FIELD FREQUENCY LOCK SYSTEM

[75] Inventors: Donald C. Hofer; Vincent N. Kahwaty, both of Poughkeepsie; Carl R. Valentino, Hopewell Junction, all of N.Y.

[73] Assignee: International Business Machines Corporation, Armonk, N.Y.

[21] Appl. No.: 769,142

[22] Filed: Feb. 16, 1977

[51] Int. Cl.² .......................................... G01R 33/08
[52] U.S. Cl. .............................. 324/0.5 A; 324/0.5 R
[58] Field of Search .......... 324/0.5 R, 0.5 A, 0.5 AC, 324/0.5 MA

[56] References Cited

U.S. PATENT DOCUMENTS

| | | | |
|---|---|---|---|
| 3,388,322 | 6/1968 | Anderson et al. | 324/0.5 R |
| 3,777,254 | 12/1973 | Kleiman et al. | 324/0.5 A |
| 3,873,909 | 3/1975 | Ernst | 324/0.5 A |

Primary Examiner—M. Tokar
Attorney, Agent, or Firm—Douglas R. McKechnie

[57] ABSTRACT

An NMR (nuclear magnetic resonance) spectrometer has a permanent magnet provided with a field coil. A lock system cyclically pulses a deuterium lock sample to produce a FID (free induction decay) signal that is analyzed by measuring the time interval during which the FID signal crosses the zero axis a predetermined number of times. The measured interval is compared to a predetermined interval or set point, and the current through the field coil is adjusted in the direction tending to correct the field strength so as to maintain the measured interval equal to the preset interval. Such measurement, comparison and adjustment are done several times each second. When the sample is removed, the lock system retains the last field setting achieved with the sample.

9 Claims, 5 Drawing Figures

NMR FIELD FREQUENCY LOCK SYSTEM

BACKGROUND OF THE INVENTION

1. Field of the Invention

This invention relates to NMR (nuclear magnetic resonance) spectrometers and, more particularly, to a novel lock system for maintaining or stabilizing a magnetic field at a constant strength.

2. Prior Art

The need and desirability of stabilizing the magnetic field used to polarize a sample in an NMR spectrometer is known in the prior art. It has been proposed to use a permanent magnet in conjunction with a field coil in which the current is varied so as to regulate the intensity of the magnetic field produced by the magnet. The amount of regulation is determined by using a control sample mixed with or placed in the vicinity of a test sample, and making a measurement of some characteristic of the control sample which characteristic is related to or affected by variations in the field intensity. Several characteristics are taught by the prior art. Most prior art designs used predominantly analog circuits throughout the lock system, and such circuits tend to be more expensive than digital circuits.

SUMMARY OF THE INVENTION

One of the objects of the invention is to provide a novel NMR lock system for stabilizing the magnetic field of a permanent magnet, which system is relatively inexpensive, and efficient, and which employs digital circuits to a large degree.

Another object is to provide a lock system which retains the best field previously achieved when a sample is removed from the NMR spectrometer.

A further object is to provide a lock system in which a deuterium control sample may be mixed with a test sample, the control sample being periodically pulsed to produce a series of FID (free induction decay) signals the periods of which are measured to generate correction factors used to alter the current flowing in a field coil.

Briefly, in accordance with the invention, a control sample is periodically pulsed to produce FID signals. Each FID signal is analyzed by measuring the time it takes for such signal to cross the zero axis a predetermined number of times. The measured time is compared to a preselected or set point time and if they are different, the current flowing through a field coil is varied in the direction tending to eliminate the difference.

Other objects and advantages of the invention will be apparent from the following detailed description taken in connection with the accompanying drawings wherein.

Figure 1:
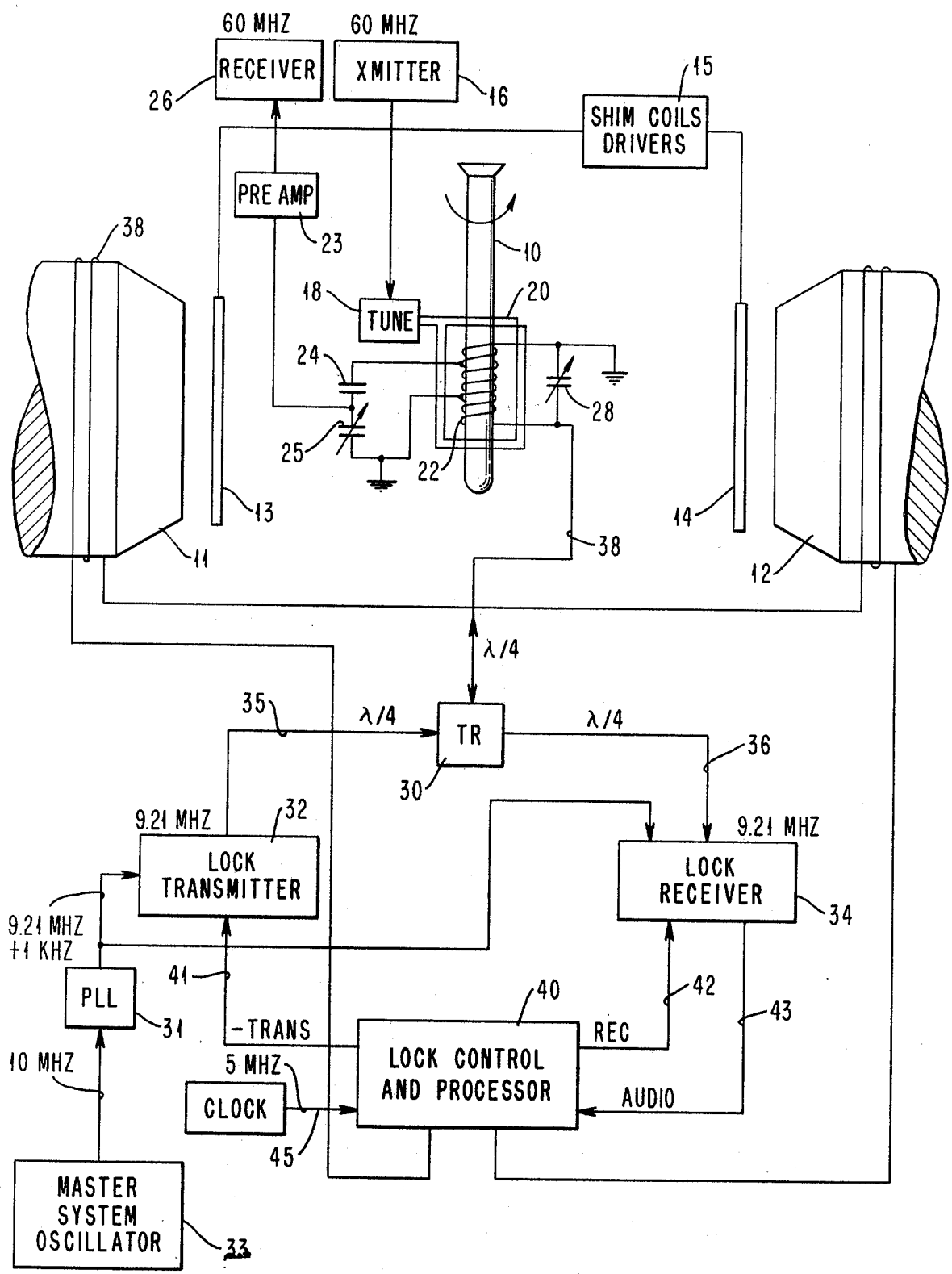
FIG. 1 is a schematic diagram of a portion of an NMR spectrometer, which portion embodies the invention.

Referring now to the drawings and first to FIG. 1, there is shown a portion of an NMR spectrometer for analyzing a sample placed in a container 10 disposed between polefaces 11 and 12 of a strong permanent magnet. Preferably, container 10 is rotated at a rate that tends to compensate for inhomogeneities in the magnetic field. Additionally, shim coils 13 and 14 are disposed adjacent the polefaces 11 and 12 and are driven by drivers 15 in a manner well known in the art to further compensate for inhomogeneities in the magnetic field. A transmitter 16 is connected through a tuning circuit 18 to a pair of coils 20 disposed on opposite sides of container 10. A coil 22 coaxially surrounds container 10 and is connected through a tuning circuit including a fixed capacitor 24 and variable capacitor 25 to a receiver 26. The portion of the spectrometer thus described is of a conventional nature and is preferably of a pulsed Fourier transform type where, in operation, transmitter 16 produces a pulsed modulated signal that is fed to coil 20 to cause the protons within the sample in container 10 within the area of coils 20 and 22 to resonate. When the pulse ceases, the protons induce in coil 22 a free induction decay signal which signal is fed through a preamplifier 23 to receiver 26 for use in analyzing the nature of the sample. The magnetic field extending between polefaces 11 and 12 is uni-directional and has a strength that is designed to resonate the sample at a predetermined frequency in a known manner. Thus, for a strength of about 14,000 gauss, the transmission and reception frequency of transmitter 16 and receiver 26 is 60 Mhz. The axis of coils 20 and 22 are located in approximately the same plane at right angles to the direction of the unidirectional magnetic field.

In accordance with the invention, in order to provide a field lock, a deuterium containing material, e.g., deuterium oxide is added to the test sample in container 10. It is known that the resonant frequency of deuterium differs from that of the hydrogen 1 proton and occurs at approximately 9.21 Mhz. Coil 22 is shaped so that the mid-section connected to receiver 26 is tuned to the nominal resonant frequency of the test sample and the full length of coil 22 is connected through a variable capacitor 28 to a transmit/receive (TR) switch 30. Capacitor 28 tunes coil 22 to a frequency centered at the resonant frequency of the deuterium or control sample. Switch 30 is connected to a transmitter 32, also known as the lock transmitter, which periodically delivers a pulse modulated RF (radio frequency) signal that excites the deuterium sample. The transmitter and receiver source frequency of 9.21 Mhz. is obtained from a PLL (phase-lock loop) 31 phase-locked to a master system oscillator 33. The 9.21 Mhz. frequency is offset from resonance at approximately 1000 Hz so as to induce out of lock receiver 34 a FID signal having a damped sinusoidal shape. A lock receiver 34 is connected through switch 30 to coil 22 and is operative to receive the FID signal generated by excitation of the deuterium. Transmitter 32 and receiver 34 are connected by quarter wavelength lines 35 and 36 respectively to switch 30 and switch 30 is connected by a quarter wavelength line 38 to coil 22 so that the switch is at the node of any standing waves in the lines and whereby the receiver can operate without interfering with operation of the transmitter. Switch 30, transmitter 32 and receiver 34 are of conventional construction and need not be described any further in detail.

As will be described in more detail below, signals from the deuterium control sample are used to control the magnetic field of the permanent magnet and to accomplish this, a field coil 38 is wound in the same direction around both poles 11 and 12 of the magnet whereby current flowing through coil 38 will induce a magnetic field that affects the primary permanent magnet field. To accomplish this, coil 38 is connected to a lock control and processor circuit 40. Circuit 40 is connected by lines 41 and 42 to provide control signals to transmitter 32 and receiver 34. Circuit 40 is also connected by line 43 to receive an audio signal from receiver 34. Circuit 40 also receives as an input on line 45 a 5 Mhz. clocking signal from a clock 44 that produces a square wave signal at levels for actuating TTL (transistor to transistor logic) technology circuits.

Figure 2:
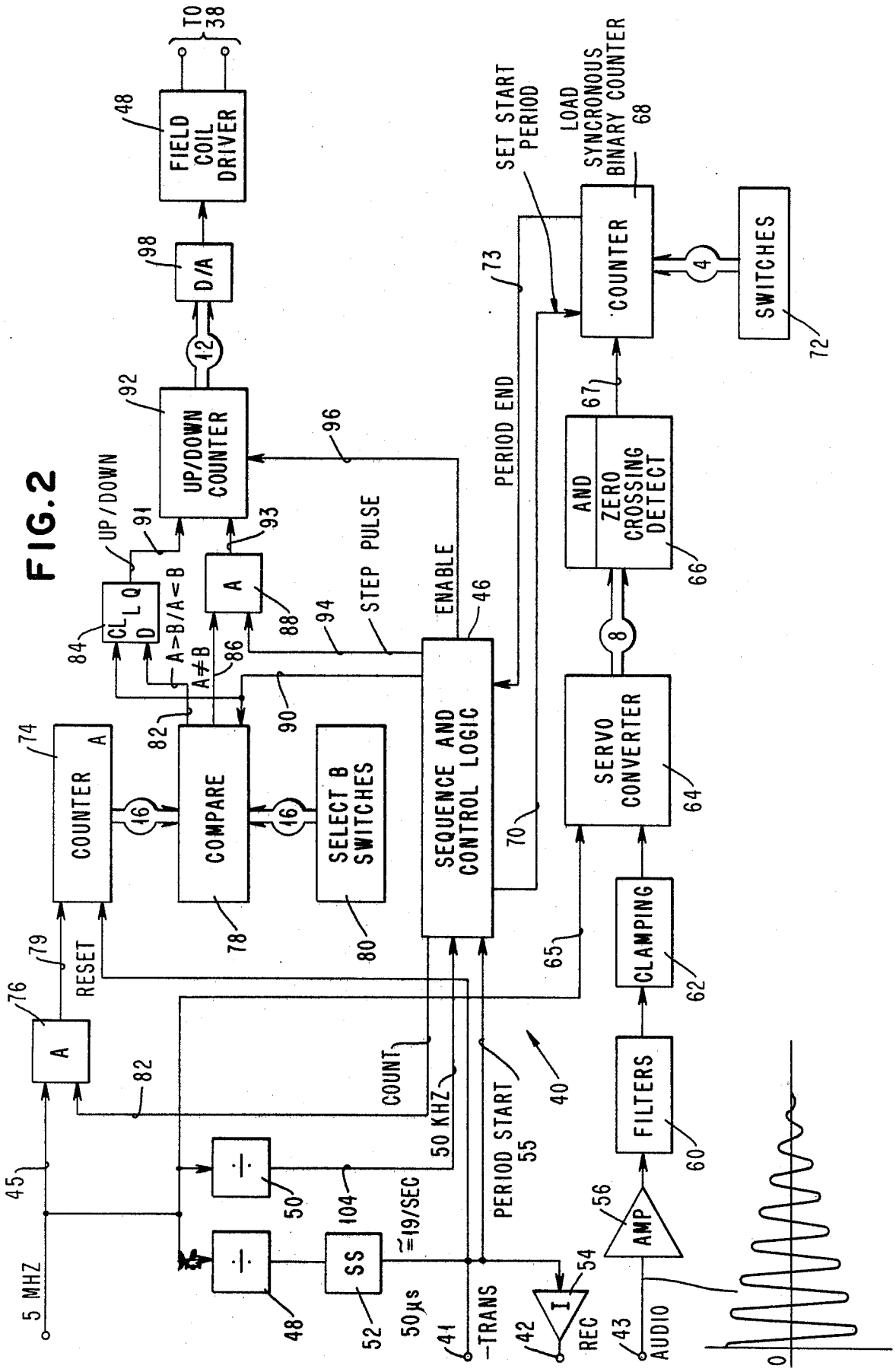
FIG. 2 is a detailed block diagram of the lock control and processor circuit shown in FIG. 1.

Referring now to FIG. 2, the components of circuit 40 are of conventional construction except for the details of the sequence and control logic circuits 46 and the field coil driver circuits 48, described in detail below. Clock input 45 is connected to a pair of dividers 48 and 50 which respectively divide the signal by 262,144 and 100 so that the outputs of these dividers are at approximately 19 Hz and 50 Khz. The output of divider 48 is connected to the input of an adjustable single shot (SS) 52 having an output that provides a nominal 50 microsecond pulse or signal at the rate at which the SS 52 is activated, i.e., about 19 per second. The output of SS 52 is connected to line 41 for providing a −TRANS pulse to transmitter 32, to an inverter 54 connected to line 42, and to line 55 connected to circuit 46. The pulse from SS 52 is a negative pulse and turns the transmitter on for 50 microseconds at a time at a rate of about 19 per second. SS 52 is adjusted to provide a pulse length that maximizes the amplitude of the FID signal. The other phase of the pulse is inverted by inverter 54 and to produce a REC signal fed by line 42 to receiver 34 to shut off the receiver during the time transmitter 32 is on. The positive going trailing edge of the pulse from SS 52 is used as the PERIOD START signal fed by line 55 to circuits 46. When this edge is generated, the transmitter is turned off, receiver 34 is turned on and the processing of the AUDIO signal resulting from the free induction decay of the deuterium, commences.

The AUDIO signal on line 43 is of damped sinusoidal form as shown schematically at the bottom of FIG. 2. This signal is amplified by an amplifier 58 and then passed through a narrow bandpass filter 60 which removes noise from the signal. The signal is then passed through a clamping circuit 62 and into a servo converter 64. The clamping circuit 62 clips any peak amplitudes from the signal. Converter 64 receives 5 Mhz. signals on line 65 for controlling the rate at which converter 64 follows the analog signal from circuit 62 and produces an eight bit signal output that is applied to the input of an AND circuit 66. This circuit functions as a zero crossing detector. The zero crossing is offset by one binary bit so as to be unaffected by noise so that every time the AND circuit detects the bit combination 00000001, it produces an output signal on line 67 that is applied to a loadable synchronous binary counter 68. The signal on line 67 is used to step counter 68. Counter 70 receives on line 70 a control signal SET TO START PERIOD which causes the settings of four switches 72 to be read into or loaded into counter 68. When the counter is thus set, the stepping pulses on line 67 step the counter, and, when the counter has received a number of stepping pulses corresponding to the setting of switches 72, a PERIOD END signal is produced on line 73. It should be appreciated that the more zero crossings that are used to define the period, the greater the accuracy of the counting and therefore switches 72 are preferably set to a number such as 10. It should be obvious that while counter 68 is used to define the period that is proportional to the intensity of the magnetic field, the actual time interval of the period may vary with variations in the field and that the time interval can be measured by use of a timing counter 74.

Counter 74 is a 16 bit binary counter that provides an output that is applied to a compare circuit 78. Counter 74 has a reset input connection to line 77 which is connected to the output of SS 52. Counter 74 also has a stepping or clocking input 79 that is connected to an AND circuit 76. One input of 76 is connected to line 45 to receive the clocking signal thereon and the other input is connected by line 82 to circuit 46 to receive a COUNT signal thereon which when active causes the clocking signal from 45 to be gated by circuit 76 to increment counter 74 at the clocking frequency of 5 mhz. When SS 52 produces the output pulse previously described, the negative level thereof causes counter 74 to be reset and when such negative pulse goes positive, counter 74 is able to step at the clocking frequency. As described below, the COUNT signal on 82 and RESET signal on 77 become active at the same time so that gate 76 passes the stepping signals on line 79. It is not until when the RESET signal goes away, that counter 74 becomes operative to count the clocking pulses. When the PERIOD END signal is received or activated on line 73, circuit 46 deactivates the COUNT signal causing counter 74 to stop counting and latch up in accordance with the number of steps. In other words, counter 74 is stepped at a fixed rate during the period that is defined by the zero crossing counter 68 and the contents of counter 74 are indicative of or proportional to the time interval of such period.

Compare circuit 78 is also connected to 16 select switches 80 which are settable to define the set point or control point around which the field strength will be regulated or controlled. Compare circuit 78 provides two outputs one of which is applied by line 82 to the input of a D-type flip-flop or latch 84 and the other of which is applied by line 86 to the input of an AND circuit 88. With the contents of counter 74 representing the value A, and the contents or setting the switches 80 representing the value B, a positive signal on line 82 indicates that A is greater than B and a negative signal thereon indicates that A is less than B. An active signal on line 86 indicates that the two values are equal, that is, A equals B. Compare circuit 78 also receives a control input on line 90 in the form of a COMPARE signal that is generated in response to the PERIOD END signal on line 73. This COMPARE signal causes comparator 78 to compare the values A and B and to generate the appropriate active signal on line 82 or 86 depending on the results of the comparison. The COMPARE signal is also fed to the clocking input of latch 84, so that the output setting thereof will reflect the status of the signal on line 82. The Q output of latch 84 is applied by line 91 to the up/down input of an up/down counter 92. This input controls the direction in which counter 92 will be incremented or decremented in response to receiving a clocking input on line 93. AND circuit 88 is connected to line 94 which receives an active STEP PULSE signal at a point in time after comparator 78 has generated the active output signal. The signal appearing on line 82 will set the direction of up/down counter 92 and the active signal of A unequal B on line 86 will cause the stepping pulse on line 94 to be passed through gate 88 and along line 93 to increment counter 92 by one step. If A is equal to B, line 86 is inactive and therefore gate 88 is inactive and the stepping pulse on line 94 is inhibited from stepping counter 92. Counter 92 is also operated in response to an ENABLE signal on line 96 connected to the enable input of the counter, the ENABLE signal being active prior to receipt of the stepping pulse.

Counter 92 produces a 12 bit binary output that is fed to a digitial-to-analog converter 98. Each time counter 92 is stepped, the binary output thereof will change by one bit. Converter 98 converts the digital signal at the input thereof to an analog signal that is fed to the input of field coil driver 48 which produces an output current that is fed to the field coil 38 to produce a magnetic field proportional thereto.

Figure 3:
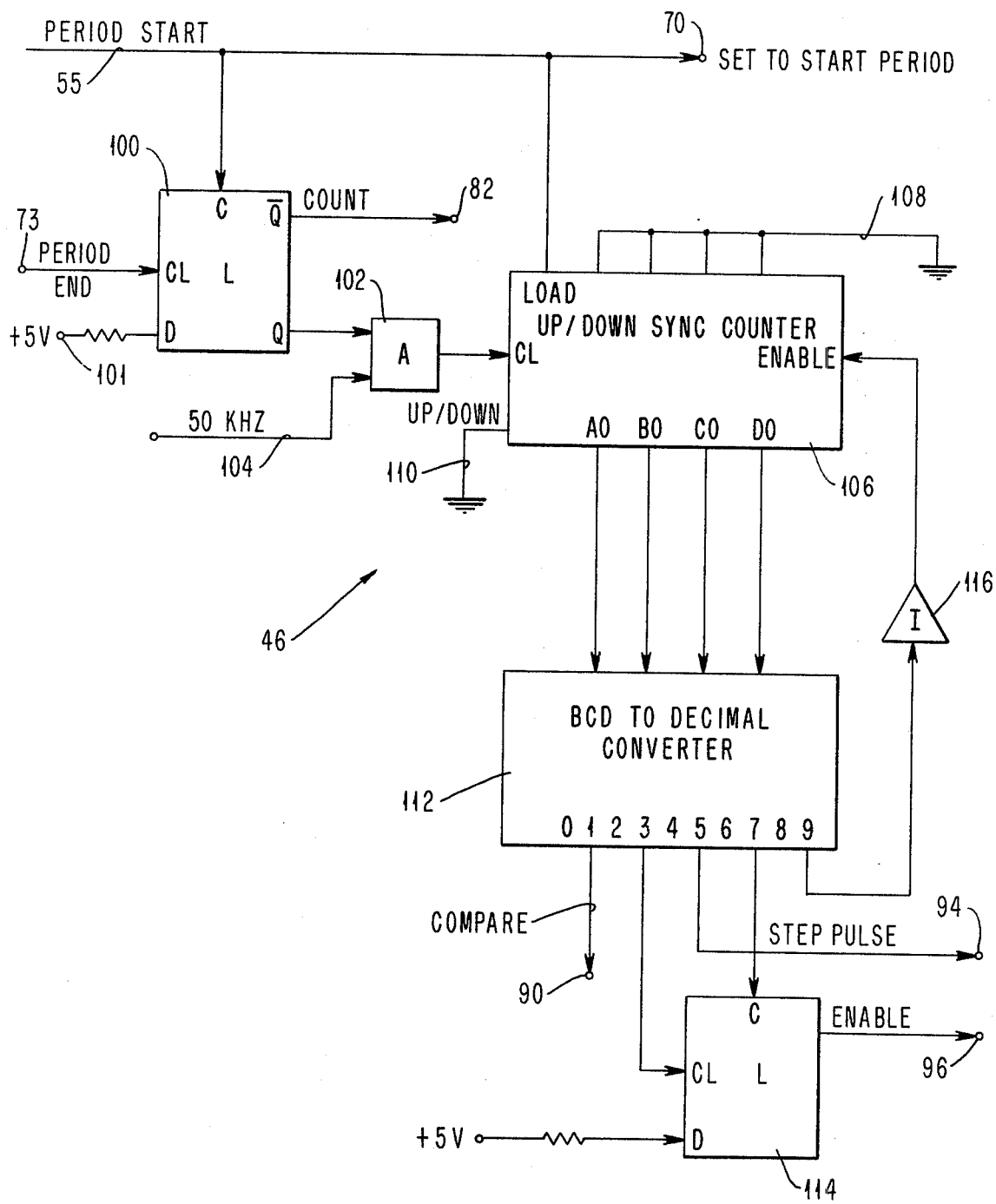
FIG. 3 is a detailed block diagram of the sequence and control logic circuit shown in FIG. 2.

Referring now to FIG. 3, it will be seen that circuit 46 includes a D-type flip-flop or latch 100 having a clear input C connected to line 55. Upon receipt of the active PERIOD START signal, latch 100 is switched so that an active count signal appears on line 82 connected to the not-Q output of the latch. The D input of latch 100 is connected via circuit 101 so that when the PERIOD END signal appears on line 73 connected to the clocking input CL of latch 100, the latch switches so that output Q becomes active. In other words, upon receipt of the PERIOD START signal, latch 100 is switched to produce the COUNT signal, and upon receipt of the PERIOD END signal, latch 100 is reset or switches back to its original state. Output Q is connected to the input of an AND circuit 102 and controls the gating thereof. The second input to gate 102 is connected by line 104 to divider 50 to receive the 50 Khz. clocking signal thereon. Thus, when the PERIOD END signal is received, gate 102 is activated to produce a series of clocking pulses on its output which pulses are applied to the clocking input CL of an up/down synchronous binary counter 106.

Figure 5:
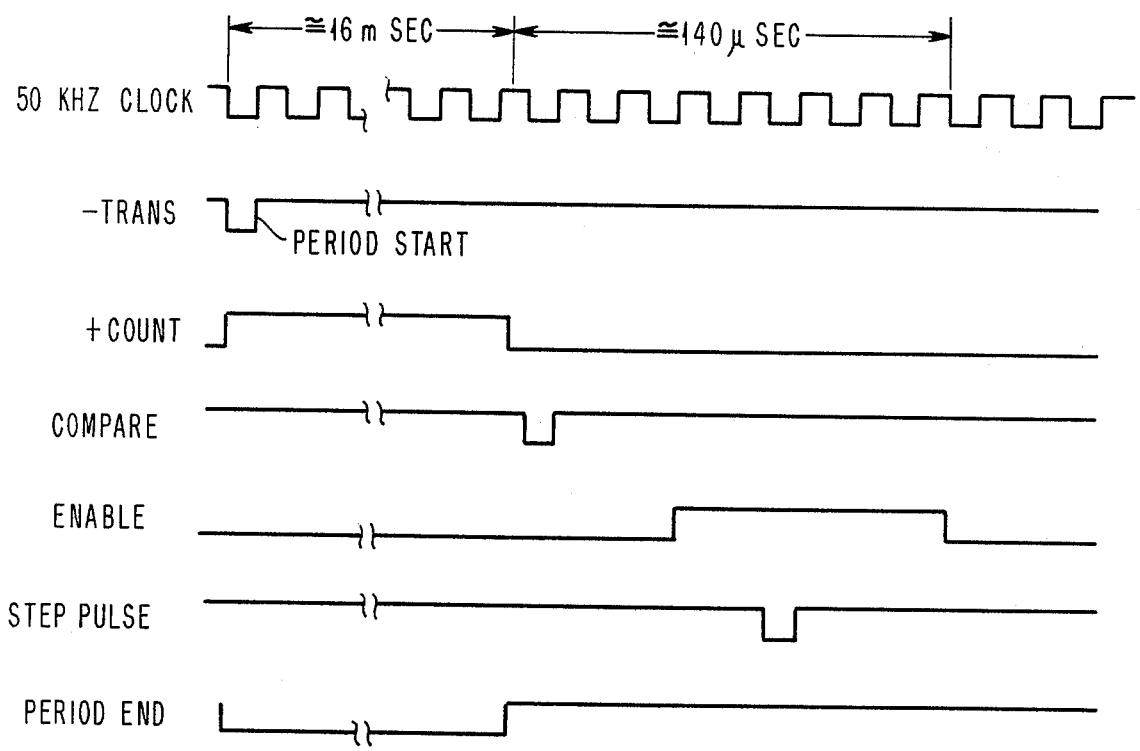
FIG. 5 is a waveform timing diagram useful in understanding the operation of the invention.

Counter 106 has four terminals A-D connected to ground through line 108 and an up/down control terminal connected to ground through line 110 so that the counter counts up. A "load" input of counter 106 is connected to line 55 so that when the PERIOD START signal is received, counter 106 is set to zero. Thereafter, when the gate 102 is activated, the clocking signals therefrom cause counter 106 to count "up". Counter 106 provides a four bit binary output on terminals $A_0 - D_0$ that is applied to the input of a BCD to decimal converter 112. This converter has 10 outputs 0-9 on which active signals sequentially appear according to the binary input. As the clocking signals cause counter 106 to count up, a series of active signals will progressively appear at the outputs 1-9. When output 9 becomes active, the signal is fed through an inverter 116 back to the enable input of counter 106 to thereby disable the counter. Thus, counter 106 is operative to count the first nine stepping or clocking pulses received through gate 102 and thereafter it is disabled. Concurrently, converter 112 converts the binary output into a series of timing signals whereby counter 106 and converter 112 form a sequencing or timing means. Converter output 1 is connected to line 90 to generate the COMPARE signal thereon. Converter output 3 is connected to the clocking input of a D-type latch 114 having a positively biased D input. The active signal applied to the clocking input CL is operative to switch latch 114 to generate an active output on Q which is connected to line 96 and provides an ENABLE signal that, as previously indicated, is used to enable and disable counter 92. Converter output 5 when active provides the STEP PULSE signal on line 94. Converter output 7 is connected to the clear input of latch 114 and the signals appearing on lines 3, 5 and 7 are used to control the operation of counter 92 in the manner previously described. FIG. 5 shows the relationships of various timing signals previously described and the significance of this figure should be obvious to those skilled in the art and will not be described in any further detail.

Figure 4:
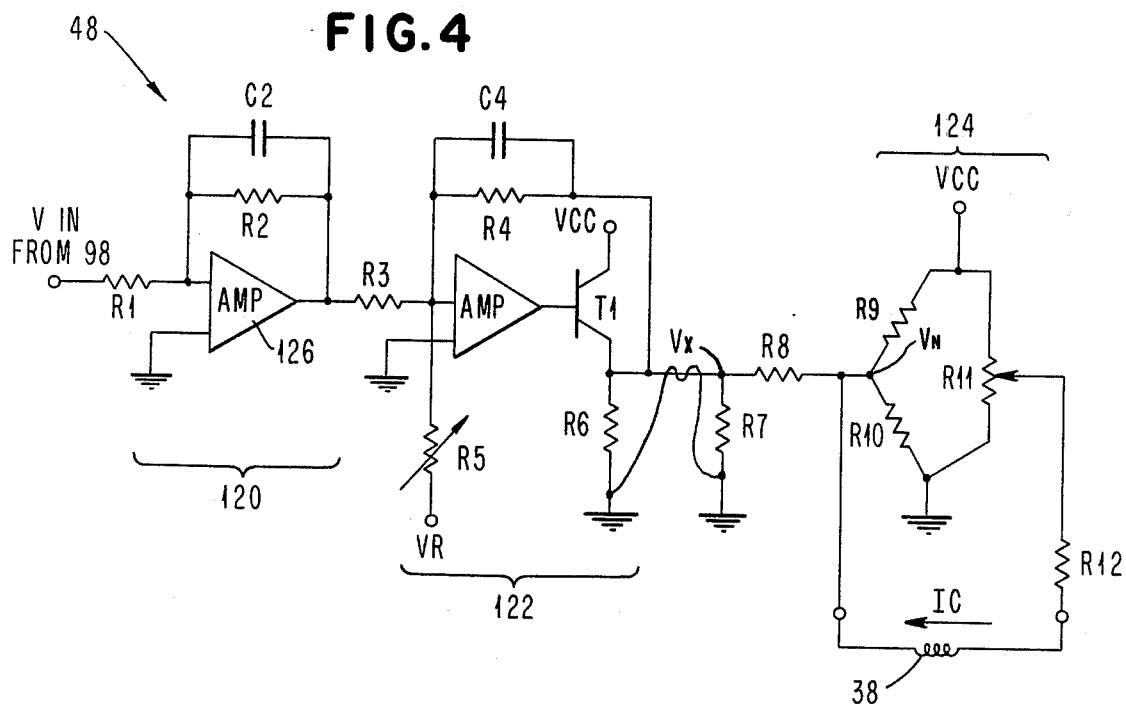
FIG. 4 is a detailed circuit diagram of the field control driver shown in FIG. 2.

Referring now to FIG. 4, driver 48 has three general portions, a gain stage 120, a summing amplifier and power driving stage 122 and a hybrid bridge circuit 124 to which field coil 38 is connected. The operation of this circuit should be readily apparent to those skilled in the art except for some design uniqueness that will now be explained. Amplifier 126 and resistor R2 provide gain and signal conversion given by the ratio of the resistances of resistors R2 and R1. A capacitor C2 provides high frequency rejection. Amplifier 128 and associated resistors R3–R6 and transistor T1 provide current driving capability and an output bias voltage $V_X$. The output bias voltage is generated by the variable resistor R5 and voltage VR in conjunction with amplifier 128. In normal operation, resistor R5 is adjusted to cause the output voltage $V_X$ to equal bridge voltage $V_n$ when the input voltage of the field coil driver is nominal. Under these conditions, the bridge circuit formed by resistors R9 and R10 and variable resistor R11 function independently of the other circuit components. This can be seen since no current flows through resistor R8 under such conditions. Resistor R7 is used as a loading element for the current driver output circuit. Resistor R12 is a current limiting element connected in series with field coil 38. Once the circuit has been calibrated whereby the field intensity is at the desired level, variations of the input voltage $V_{IN}$ will vary $V_X$ and, hence, current $I_C$ will vary in essentially direct proportion over the control range.

Should container 10 be removed from the spectrometer, circuits 40 will not change the amount of current flowing through field coil 38. In other words, the system holds at the last locking setting, which is presumably the best setting. The manner in which this is accomplished will now be described. When container 10 is removed, no AUDIO signal (only noise) occurs on line 43. SS 52 operates to periodically generate the PERIOD START signals but, because of the lack of the AUDIO signal, circuit 66 does not detect any zero crossings, counter 68 is not stepped and no PERIOD END signal is generated. Consequently, counter 92 does not change and the field current is at the level established by the unchanged contents of counter 92. The lock process will resume when container 10 and control sample are reinserted into the spectrometer whereupon an AUDIO signal will be generated allowing the process to proceed in the manner described above.

It should be apparent to those skilled in the art that various changes and omissions in the details, arrangements and parts can be made without departing from the spirit and scope of the invention as defined in the appended claims.

What is claimed is:

1. In an NMR spectrometer comprising a permanent magnet providing a magnetic field for polarizing a control sample and a test sample, and a field coil for varying the intensity of the magnetic field, the combination comprising:

means for periodically applying a pulse modulated RF magnetic field to excite said control sample at a resonant frequency, said pulse modulated RF magnetic field having a frequency offset from said resonant frequency of said control sample to periodically produce free induction decay signals each having a period of oscillation;
means for detecting said free induction decay signals;
means for measuring said period of each of said decay signals comprising
  means for converting each said decay signal into digital representations thereof including values that cyclically cross a zero axis,
  digital means for detecting when said values have crossed said zero axis a predetermined number of times,
  and digital timing means operable concurrently with operation of said last mentioned detecting means for providing digital indications of the amount of time it takes to cross said zero axis said predetermined number of times, said indications being proportional to the length of said periods;
and means responsive to said indications for varying said current in said field coil, when each said indication differs from a predetermined value, so as to tend to maintain said periods at a predetermined constant value.

2. The combination of claim 1 wherein said varying means comprises:
  storage means storing a predetermined digital value;
  comparator means connected to said storage means and said timing means and operative to compare said predetermined digital value with each of said digital representations and provide an output signal in response to a difference therebetween;
  and selectively changed storage means having a variable value stored therein and being responsive to said output signal for changing said variable value, said variable value controlling the amount of said current in said first coil.

3. The combination of claim 2 wherein said selectively changed storage means is a digital counter that is incremented by a fixed amount in response to each said output signal.

4. In an NMR spectrometer having a polarizing magnet and a field coil for varying the intensity of the magnetic field produced by said magnet, a lock system comprising:
  first means for detecting excitation of a control sample placed in said magnetic field;
  selectively actuated second means operative to periodically excite said control sample at a resonant frequency by means of pulse modulated RF signals each having a frequency offset from said resonant frequency of said control sample so as to periodically produce in said first means free induction decay signals each of a damped sinusoidal form;
  selectively variable third means for controlling the flow of current through said field coil;
  and fourth means operative to measure the period of each decay signal and vary said third means so as to alter the amount of current flowing through said field coil so as to tend to maintain the length of each period at a constant value, said fourth means comprising
  a selectively actuated timing counter,
  fifth means operative to actuate said timing counter for an interval proportional to the length of each of said periods,
  storage means having a set point value stored therein,
  and comparator means operative to compare the contents of said timing counter with said set point value and producing an incremental variation in said third means when such contents differs from said set point value.

5. The combination of claim 4 wherein said fifth means comprises detecting means operative to detect a predetermined number of oscillations in each of said decay signals to establish said interval during which said timing counter is actuated.

6. The combination of claim 4 comprising:
  control means for controlling operation of said lock system, said control means comprising,
  a source of periodic timing pulses,
  means connecting said source to said first and second means for controlling operation thereof,
  sequencing means connected to said source and operative upon deactuation of said second means to generate a series of timing signals controlling operation of said fourth means.

7. The combination of claim 6 wherein said fourth means comprises:
  converting means connected to receive said decay signals and converts each one into a digital representation thereof,
  selectively actuated counting means operatively connected to count a predetermined number of oscillations in each digital representation, said counting means being actuated by a timing pulse and operative to produce a deactuation pulse when said counting means has reached said predetermined number,
  and selectively actuated timing means operatively connected to be actuated by a timing pulse at the start of operation of said counting means and deactuated by said deactuation pulse so as to provide a first manifestation of the time interval during which said predetermined number of oscillations occur.

8. The combination of claim 7 wherein said fourth means further comprises:
  storage means for storing a set point manifestation,
  comparator means connected to said storage means and said timing means for comparing said first manifestation with said set point manifestation and providing signals indicating the equality or inequality of such manifestations,
  an up/down counter settable to the direction of counting by said signals indicating the inequality of such manifestations, said up/down counter having a stepping input connected to said sequencing means and operative to step said up/down counter in response to a stepping pulse therefrom,
  gate means responsive to said signal indicating the equality of such manifestations for inhibiting stepping of said up/down counter,
  and means controlled by the contents of said up/down counter for supplying to said field coil a current proportional to said contents.

9. In an NMR spectrometer having a polarizing magnet and a field coil for varying the intensity of the magnetic field produced by said magnet, a lock system comprising:
  a source of periodic timing pulses;
  first means including a transmitter operative in response to each timing pulse to turn said transmitter on and off to thereby excite at a resonant frequency a control sample placed in said spectrometer by means of a pulse modulated RF signal having a frequency offset from the resonant frequency of said control sample;

second means including a receiver operative each time said transmitter has been turned off to detect excitation of said control sample and produce a free induction decay signal having a damped sinusoidal form;

measuring means for determining the period of oscillation of said decay signal and producing an output control signal proportional thereto;

variable control means responsive to said control signal for controlling the amount of current flowing through said field coiled whereby a variation of said control signal from a predetermined value is operative to vary said control means and hence the intensity of said magnetic field, said control means being initially set to some level while a control sample is in said spectrometer and operative to remain at such level when said control sample is removed from said spectrometer whereby said lock system holds said magnetic field at a constant level when said control sample is removed;

counting means included in said measuring means for counting a predetermined number of oscillations of said decay signal, said counting means being activated by a starting signal and operative to produce a counting end signal when said predetermined number has been counted;

third means responsive to said counting end signal for controlling when said variable control means can be varied;

and timing means operative to repetitively produce starting signals;

said counting means being inoperative to count when said control sample is removed whereby no counting end signal is produced until said control sample is placed back in said spectrometer.

* * * * *